US 9,450,097 B2

(12) United States Patent
Tsai et al.

(10) Patent No.: US 9,450,097 B2
(45) Date of Patent: *Sep. 20, 2016

(54) METHODS FOR DOPING FIN FIELD-EFFECT TRANSISTORS AND FIN FIELD-EFFECT TRANSISTOR

(71) Applicant: TAIWAN SEMICONDUCTOR MANUFACTURING COMPANY, LTD., Hsinchu (TW)

(72) Inventors: Chun Hsiung Tsai, Xinpu Township (TW); Yu-Lien Huang, Jhubei (TW); De-Wei Yu, Ping-Tung (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/943,704

(22) Filed: Nov. 17, 2015

(65) Prior Publication Data

US 2016/0071973 A1 Mar. 10, 2016

Related U.S. Application Data

(63) Continuation of application No. 14/621,035, filed on Feb. 12, 2015, now Pat. No. 9,209,280, which is a continuation of application No. 12/768,884, filed on Apr. 28, 2010, now Pat. No. 8,980,719.

(51) Int. Cl.
*H01L 21/225* (2006.01)
*H01L 21/66* (2006.01)
(Continued)

(52) U.S. Cl.
CPC ....... *H01L 29/785* (2013.01); *H01L 21/02274* (2013.01); *H01L 21/2254* (2013.01);
(Continued)

(58) Field of Classification Search
CPC ............. H01L 29/785; H01L 21/2254; H01L 29/66803; H01L 21/324; H01L 29/167; H01L 21/02274; H01L 29/1608; H01L 29/161; H01L 29/7834; H01L 29/7842
See application file for complete search history.

(56) References Cited

U.S. PATENT DOCUMENTS

| 4,830,983 A | 5/1989 | Thornton |
| 5,407,847 A | 4/1995 | Hayden et al. |

(Continued)

FOREIGN PATENT DOCUMENTS

| CN | 1945829 | 4/2004 |
| CN | 101179046 | 5/2005 |

(Continued)

OTHER PUBLICATIONS

Office Action dated May 2, 2012 from corresponding application No. CN 201010196345.0.

(Continued)

*Primary Examiner* — Savitr Mulpuri
(74) *Attorney, Agent, or Firm* — Hauptman Ham, LLP

(57) ABSTRACT

A method of doping a fin field-effect transistor includes forming a plurality of semiconductor fins on a substrate wherein each semiconductor fin of the plurality of semiconductor fins has a top surface and sidewalls. The method includes forming a gate stack over the top surface and sidewalls of each semiconductor fin. The method includes removing a portion of a first semiconductor fin exposed by the gate stack. The method includes growing a first stressor region connected to a remaining portion of the first semiconductor fin. The method includes exposing a second semiconductor fin to a deposition process to form a dopant-rich layer comprising an n-type or a p-type dopant on the top surface and the sidewalls of the second semiconductor fin. The method includes diffusing the dopant from the dopant-rich layer into the second semiconductor fin using an annealing process.

20 Claims, 6 Drawing Sheets

(51) Int. Cl.
  *H01L 29/78* (2006.01)
  *H01L 29/66* (2006.01)
  *H01L 21/324* (2006.01)
  *H01L 29/167* (2006.01)
  *H01L 21/02* (2006.01)
  *H01L 29/16* (2006.01)
  *H01L 29/161* (2006.01)

(52) U.S. Cl.
  CPC ......... *H01L21/2255* (2013.01); *H01L 21/324* (2013.01); *H01L 29/161* (2013.01); *H01L 29/167* (2013.01); *H01L 29/1608* (2013.01); *H01L 29/66803* (2013.01); *H01L 29/7834* (2013.01); *H01L 29/7842* (2013.01)

(56) References Cited

U.S. PATENT DOCUMENTS

| | | |
|---|---|---|
| 5,581,202 A | 12/1996 | Yano et al. |
| 5,658,417 A | 8/1997 | Watanabe et al. |
| 5,767,732 A | 6/1998 | Lee et al. |
| 5,949,986 A | 9/1999 | Riley et al. |
| 5,963,789 A | 10/1999 | Tsuchiaki |
| 6,065,481 A | 5/2000 | Fayfield et al. |
| 6,121,786 A | 9/2000 | Yamagami et al. |
| 6,299,724 B1 | 10/2001 | Fayfield et al. |
| 6,503,794 B1 | 1/2003 | Watanabe et al. |
| 6,613,634 B2 | 9/2003 | Ootsuka et al. |
| 6,622,738 B2 | 9/2003 | Scovell |
| 6,642,090 B1 | 11/2003 | Fried et al. |
| 6,706,571 B1 | 3/2004 | Yu et al. |
| 6,713,365 B2 | 3/2004 | Lin et al. |
| 6,727,557 B2 | 4/2004 | Takao |
| 6,740,247 B1 | 5/2004 | Han et al. |
| 6,743,673 B2 | 6/2004 | Watanabe et al. |
| 6,762,448 B1 | 7/2004 | Lin et al. |
| 6,791,155 B1 | 9/2004 | Lo et al. |
| 6,828,646 B2 | 12/2004 | Marty et al. |
| 6,830,994 B2 | 12/2004 | Mitsuki et al. |
| 6,858,478 B2 | 2/2005 | Chau et al. |
| 6,872,647 B1 | 3/2005 | Yu et al. |
| 6,940,747 B1 | 9/2005 | Sharma et al. |
| 6,949,768 B1 | 9/2005 | Anderson et al. |
| 6,964,832 B2 | 11/2005 | Moniwa et al. |
| 7,009,273 B2 | 3/2006 | Inoh et al. |
| 7,018,901 B1 | 3/2006 | Thean et al. |
| 7,026,232 B1 | 4/2006 | Koontz et al. |
| 7,067,400 B2 | 6/2006 | Bedell et al. |
| 7,078,312 B1 | 7/2006 | Sutanto et al. |
| 7,084,079 B2 | 8/2006 | Conti et al. |
| 7,084,506 B2 | 8/2006 | Takao |
| 7,112,495 B2 | 9/2006 | Ko et al. |
| 7,153,744 B2 | 12/2006 | Chen et al. |
| 7,157,351 B2 | 1/2007 | Cheng et al. |
| 7,190,050 B2 | 3/2007 | King et al. |
| 7,193,399 B2 | 3/2007 | Aikawa |
| 7,235,436 B1 | 6/2007 | Lin et al. |
| 7,247,887 B2 | 7/2007 | King et al. |
| 7,265,008 B2 | 9/2007 | King et al. |
| 7,265,418 B2 | 9/2007 | Yun et al. |
| 7,297,600 B2 | 11/2007 | Oh et al. |
| 7,300,837 B2 | 11/2007 | Chen et al. |
| 7,315,994 B2 | 1/2008 | Aller et al. |
| 7,323,375 B2 | 1/2008 | Yoon et al. |
| 7,338,614 B2 | 3/2008 | Martin et al. |
| 7,351,622 B2 | 4/2008 | Buh et al. |
| 7,358,166 B2 | 4/2008 | Agnello et al. |
| 7,361,563 B2 | 4/2008 | Shin et al. |
| 7,374,986 B2 | 5/2008 | Kim et al. |
| 7,394,116 B2 | 7/2008 | Kim et al. |
| 7,396,710 B2 | 7/2008 | Okuno |
| 7,407,847 B2 | 8/2008 | Doyle et al. |
| 7,410,844 B2 | 8/2008 | Li et al. |
| 7,425,740 B2 | 9/2008 | Liu et al. |
| 7,442,967 B2 | 10/2008 | Ko et al. |
| 7,456,087 B2 | 11/2008 | Cheng |
| 7,494,862 B2 | 2/2009 | Doyle et al. |
| 7,508,031 B2 | 3/2009 | Liu et al. |
| 7,528,465 B2 | 5/2009 | King et al. |
| 7,534,689 B2 | 5/2009 | Pal et al. |
| 7,538,387 B2 | 5/2009 | Tsai |
| 7,538,391 B2 | 5/2009 | Chidambarrao et al. |
| 7,550,332 B2 | 6/2009 | Yang |
| 7,598,145 B2 | 10/2009 | Damlencourt et al. |
| 7,605,449 B2 | 10/2009 | Liu et al. |
| 7,682,911 B2 | 3/2010 | Jang et al. |
| 7,759,228 B2 | 7/2010 | Sugiyama et al. |
| 7,795,097 B2 | 9/2010 | Pas |
| 7,798,332 B1 | 9/2010 | Brunet |
| 7,820,513 B2 | 10/2010 | Hareland et al. |
| 7,851,865 B2 | 12/2010 | Anderson et al. |
| 7,868,317 B2 | 1/2011 | Yu et al. |
| 7,898,041 B2 | 3/2011 | Radosavljevic et al. |
| 7,923,321 B2 | 4/2011 | Lai et al. |
| 7,923,339 B2 | 4/2011 | Meunier-Beillard et al. |
| 7,960,791 B2 | 6/2011 | Anderson et al. |
| 7,985,633 B2 | 7/2011 | Cai et al. |
| 7,989,846 B2 | 8/2011 | Furuta |
| 7,989,855 B2 | 8/2011 | Narihiro |
| 8,003,466 B2 | 8/2011 | Shi et al. |
| 8,043,920 B2 | 10/2011 | Chan et al. |
| 8,076,189 B2 | 12/2011 | Grant |
| 8,101,475 B2 | 1/2012 | Oh et al. |
| 8,361,871 B2 | 1/2013 | Pillarisetty et al. |
| 2002/0144230 A1 | 10/2002 | Rittman |
| 2003/0080361 A1 | 5/2003 | Murthy et al. |
| 2003/0109086 A1 | 6/2003 | Arao |
| 2003/0145299 A1 | 7/2003 | Fried et al. |
| 2003/0234422 A1 | 12/2003 | Wang et al. |
| 2004/0048424 A1 | 3/2004 | Wu et al. |
| 2004/0075121 A1 | 4/2004 | Yu et al. |
| 2004/0129998 A1 | 7/2004 | Inoh et al. |
| 2004/0192067 A1 | 9/2004 | Ghyselen et al. |
| 2004/0219722 A1 | 11/2004 | Pham et al. |
| 2004/0259315 A1 | 12/2004 | Sakaguchi et al. |
| 2005/0020020 A1 | 1/2005 | Collaert et al. |
| 2005/0051865 A1 | 3/2005 | Lee et al. |
| 2005/0082616 A1 | 4/2005 | Chen et al. |
| 2005/0153490 A1 | 7/2005 | Yoon et al. |
| 2005/0170593 A1 | 8/2005 | Kang et al. |
| 2005/0212080 A1 | 9/2005 | Wu et al. |
| 2005/0221591 A1 | 10/2005 | Bedell et al. |
| 2005/0224800 A1 | 10/2005 | Lindert et al. |
| 2005/0233598 A1 | 10/2005 | Jung et al. |
| 2005/0266698 A1 | 12/2005 | Cooney et al. |
| 2005/0280102 A1 | 12/2005 | Oh et al. |
| 2006/0038230 A1 | 2/2006 | Ueno et al. |
| 2006/0068553 A1 | 3/2006 | Thean et al. |
| 2006/0091481 A1 | 5/2006 | Li et al. |
| 2006/0091482 A1 | 5/2006 | Kim et al. |
| 2006/0091937 A1 | 5/2006 | Do |
| 2006/0105557 A1 | 5/2006 | Klee et al. |
| 2006/0128071 A1 | 6/2006 | Rankin et al. |
| 2006/0138572 A1 | 6/2006 | Arikado et al. |
| 2006/0151808 A1 | 7/2006 | Chen et al. |
| 2006/0153995 A1 | 7/2006 | Narwankar et al. |
| 2006/0166475 A1 | 7/2006 | Manti |
| 2006/0214212 A1 | 9/2006 | Horita et al. |
| 2006/0258156 A1 | 11/2006 | Kitti |
| 2007/0001173 A1 | 1/2007 | Brask et al. |
| 2007/0004218 A1 | 1/2007 | Lee et al. |
| 2007/0015334 A1 | 1/2007 | Kitti et al. |
| 2007/0020827 A1 | 1/2007 | Buh et al. |
| 2007/0024349 A1 | 2/2007 | Tsukude |
| 2007/0026615 A1 | 2/2007 | Goktepeli et al. |
| 2007/0029576 A1 | 2/2007 | Nowak et al. |
| 2007/0048907 A1 | 3/2007 | Lee et al. |
| 2007/0063276 A1 | 3/2007 | Beintner |
| 2007/0076477 A1 | 4/2007 | Hwang et al. |
| 2007/0084564 A1 | 4/2007 | Gupta et al. |
| 2007/0093010 A1 | 4/2007 | Mathew et al. |
| 2007/0093036 A1 | 4/2007 | Cheng et al. |
| 2007/0096148 A1 | 5/2007 | Hoentschel et al. |
| 2007/0120156 A1 | 5/2007 | Liu et al. |

(56) References Cited

U.S. PATENT DOCUMENTS

| | | |
|---|---|---|
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0145487 A1 | 6/2007 | Kavalieros et al. |
| 2007/0152276 A1 | 7/2007 | Arnold et al. |
| 2007/0166929 A1 | 7/2007 | Matsumoto et al. |
| 2007/0178637 A1 | 8/2007 | Jung et al. |
| 2007/0221956 A1 | 9/2007 | Inaba |
| 2007/0236278 A1 | 10/2007 | Hur et al. |
| 2007/0241414 A1 | 10/2007 | Narihiro |
| 2007/0247906 A1 | 10/2007 | Watanabe et al. |
| 2007/0254440 A1 | 11/2007 | Daval |
| 2008/0001171 A1 | 1/2008 | Tezuka et al. |
| 2008/0036001 A1 | 2/2008 | Yun et al. |
| 2008/0042209 A1 | 2/2008 | Tan et al. |
| 2008/0050882 A1 | 2/2008 | Bevan et al. |
| 2008/0085580 A1 | 4/2008 | Doyle et al. |
| 2008/0085590 A1 | 4/2008 | Yao et al. |
| 2008/0095954 A1 | 4/2008 | Gabelnick et al. |
| 2008/0102586 A1 | 5/2008 | Park |
| 2008/0124878 A1 | 5/2008 | Cook et al. |
| 2008/0227241 A1 | 9/2008 | Nakabayashi et al. |
| 2008/0265344 A1 | 10/2008 | Mehrad et al. |
| 2008/0290470 A1 | 11/2008 | King et al. |
| 2008/0296632 A1 | 12/2008 | Moroz et al. |
| 2008/0318392 A1 | 12/2008 | Hung et al. |
| 2009/0026540 A1 | 1/2009 | Sasaki et al. |
| 2009/0035909 A1* | 2/2009 | Chang ............ H01L 21/823807 438/276 |
| 2009/0039388 A1 | 2/2009 | Teo et al. |
| 2009/0066763 A1 | 3/2009 | Fujii et al. |
| 2009/0155969 A1 | 6/2009 | Chakravarti et al. |
| 2009/0166625 A1 | 7/2009 | Ting et al. |
| 2009/0181477 A1 | 7/2009 | King et al. |
| 2009/0200612 A1 | 8/2009 | Koldiaev |
| 2009/0239347 A1 | 9/2009 | Ting et al. |
| 2009/0309162 A1 | 12/2009 | Baumgartner et al. |
| 2009/0321836 A1 | 12/2009 | Wei et al. |
| 2010/0155790 A1 | 6/2010 | Lin et al. |
| 2010/0163926 A1 | 7/2010 | Hudait et al. |
| 2010/0183961 A1 | 7/2010 | Shieh et al. |
| 2010/0187613 A1 | 7/2010 | Colombo et al. |
| 2010/0207211 A1 | 8/2010 | Sasaki et al. |
| 2010/0308379 A1 | 12/2010 | Kuan et al. |
| 2011/0018065 A1 | 1/2011 | Curatola et al. |
| 2011/0108920 A1 | 5/2011 | Basker et al. |
| 2011/0129990 A1 | 6/2011 | Mandrekar et al. |
| 2011/0195555 A1 | 8/2011 | Tsai et al. |
| 2011/0195570 A1 | 8/2011 | Lin et al. |
| 2011/0256682 A1 | 10/2011 | Yu et al. |
| 2012/0086053 A1 | 4/2012 | Tseng et al. |

FOREIGN PATENT DOCUMENTS

| | | |
|---|---|---|
| CN | 101359622 | 2/2009 |
| CN | 101459116 | 6/2009 |
| JP | 2007-194336 | 8/2007 |
| KR | 10-2005-0119424 | 12/2005 |
| KR | 1020070064231 | 6/2007 |
| TW | 497253 | 8/2002 |
| WO | WO2007/115585 | 10/2007 |

OTHER PUBLICATIONS

Office Action dated May 4, 2012 from corresponding application No. CN 201010243667.6.

Office Action dated Jun. 20, 2012 from corresponding application No. CN 201010263807.6.

Office Action dated Apr. 8, 2013 from corresponding application No. CN201010263807.6.

Anathan, Hari, et al., "FinFet SRAM—Device and Circuit Design Considerations", Quality Electronic Design, 2004, Proceedings 5th International Symposium (2004); pp. 511-516.

Jha, Niraj, Low-Power FinFET Circuit Design, Dept. of Electrical Engineering, Princeton University n.d.

Kedzierski, J., et al., "Extension and Source/Drain Design for High-Performance FinFET Devices", IEEE Transactions on Electron Devices, vol. 50, No. 4, Apr. 2003, pp. 952-958.

Liow, Tsung-Yang et al., "Strained N-Channel FinFETs with 25 nm Gate Length and Silicon-Carbon Source/Drain Regions for Performance Enhancement", VLSI Technology, 2006, Digest of Technical Papers, 2006 Symposium on VLSI Technology 2006; pp. 56-57.

Quirk et al., Semiconductor Manufacturing Technology, Oct. 2001, Prentice Hall, Chapter 16.

McVittie, James P., et al., "SPEEDIE: A Profile Simulator for Etching and Deposition", Proc. SPIE 1392, 126 (1991).

90 nm Technology. retrieved from the internet <URL:http://tsmc.com/english/dedicatedFoundry/technology/90nm.htm.

Merriam Webster definition of substantially retrieved from the internet <URL:http://www.merriam-webster.com/dictionary/substantial>.

Smith, Casey Eben, Advanced Technology for Source Drain Resistance, Diss. University of North Texas, 2008.

Liaw, Tsung-Yang et al., "Strained N-Channel FinFETs Featuring in Situ Doped Silicon-Carbon Si1-YCy Source Drain Stressors with High Carbon Content", IEEE Transactions on Electron Devices 55_9 {2008): 2475-483.

Office Action dated Mar. 28, 2012 from corresponding application No. CN 201010228334.6.

Notice of Decision on Patent dated Mar. 12, 2012 and English translation from corresponding application No. KR10-2010-0072103.

OA dated Mar. 27, 2012 from corresponding application No. KR10-2010-0094454.

OA dated Mar. 29, 2012 from corresponding application No. KR10-2010-0090264.

Lenoble, Damien, STMicroelectronics, Crolles Cedex, France, "Plasma Doping as an Alternative Route for Ultra-Shallow Junction Integration to Standard CMOS Technologies", Semiconductor Fabtech—16th Edition, pp. 1-5.

Shikida, Mitsuhiro, et al., "Comparison of Anisotropic Etching Properties Between KOH and TMAH Solutions", IEEE Xplore, Jun. 30, 2010, pp. 315-320.

Chui, King-Jien, et al., "Source/Drain Germanium Condensation for P-Channel Strained Ultra-Thin Body Transistors", Silicon Nano Device Lab, Dept. of Electrical and Computer Engineering, National University of Singapore; IEEE 2005.

Tezuka, T., et al., "Dislocation-Free Formation of Relaxed SiGe-on-Insulators Layers", Applied Physics Letters, vol. 80, No. 19, May 13, 2002, pp. 3560-3562.

* cited by examiner

METHODS FOR DOPING FIN FIELD-EFFECT TRANSISTORS AND FIN FIELD-EFFECT TRANSISTOR

PRIORITY CLAIM

The present application is a continuation of U.S. application Ser. No. 14/621,035, filed Feb. 12, 2015, which is a continuation of U.S. application Ser. No. 12/768,884, filed Apr. 28, 2010, now U.S. Pat. No. 8,980,719, issued Mar. 17, 2015, which are incorporated herein by reference in their entireties.

RELATED APPLICATIONS

The present application is related to U.S. patent application Ser. No. 12/707,788, filed on Feb. 18, 2010, titled MEMORY POWER GATING CIRCUIT AND METHODS; Ser. No. 12/758,426, filed on Apr. 12, 2010, titled FINFETS AND METHODS FOR FORMING THE SAME; Ser. No. 12/731,325, filed on Mar. 25, 2010, titled ELECTRICAL FUSE AND RELATED APPLICATIONS; Ser. No. 12/724,556, filed on Mar. 16, 2010, titled ELECTRICAL ANTIFUSE AND RELATED APPLICATIONS; Ser. No. 12/757,203, filed on Apr. 9, 2010, titled STI STRUCTURE AND METHOD OF FORMING BOTTOM VOID IN SAME; Ser. No. 12/797,839, filed on Jun. 10, 2010, titled FIN STRUCTURE FOR HIGH MOBILITY MULTIPLE-GATE TRANSISTOR; Ser. No. 12/831,842, filed on Jul. 7, 2010, titled METHOD FOR FORMING HIGH GERMANIUM CONCENTRATION SiGe STRESSOR; Ser. No. 12/761,686, filed on Apr. 16, 2010, titled FINFETS AND METHODS FOR FORMING THE SAME; Ser. No. 12/766,233, filed on Apr. 23, 2010, titled FIN FIELD EFFECT TRANSISTOR; Ser. No. 12/757,271, filed on Apr. 9, 2010, titled ACCUMULATION TYPE FINFET, CIRCUITS AND FABRICATION METHOD THEREOF; Ser. No. 12/694,846, filed on Jan. 27, 2010, titled INTEGRATED CIRCUITS AND METHODS FOR FORMING THE SAME; Ser. No. 12/638,958, filed on Dec. 14, 2009, titled METHOD OF CONTROLLING GATE THICKNESS IN FORMING FINFET DEVICES; Ser. No. 12/768,884, filed on Apr. 28, 2010, titled METHODS FOR DOPING FIN FIELD-EFFECT TRANSISTORS; Ser. No. 12/731,411, filed on Mar. 25, 2010, titled INTEGRATED CIRCUIT INCLUDING FINFETS AND METHODS FOR FORMING THE SAME; Ser. No. 12/775,006, filed on May 6, 2010, titled METHOD FOR FABRICATING A STRAINED STRUCTURE; Ser. No. 12/886,713, filed Sep. 21, 2010, titled METHOD OF FORMING INTEGRATED CIRCUITS; Ser. No. 12/941,509, filed Nov. 8, 2010, titled MECHANISMS FOR FORMING ULTRA SHALLOW JUNCTION; Ser. No. 12/900,626, filed Oct. 8, 2010, titled TRANSISTOR HAVING NOTCHED FIN STRUCTURE AND METHOD OF MAKING THE SAME; Ser. No. 12/903,712, filed Oct. 13, 2010, titled FINFET AND METHOD OF FABRICATING THE SAME; 61/412,846, filed Nov. 12, 2010, 61/394,418, filed Oct. 19, 2010, titled METHODS OF FORMING GATE DIELECTRIC MATERIAL and 61/405,858, filed Oct. 22, 2010, titled METHODS OF FORMING SEMICONDUCTOR DEVICES.

TECHNICAL FIELD

The disclosure relates generally to integrated circuit devices, and more particularly to methods for doping fin field-effect transistors (FinFETs).

BACKGROUND

In the rapidly advancing semiconductor manufacturing industry, complementary metal oxide semiconductor (CMOS) FinFET devices may be used in many logic and other applications and are integrated into various different types of semiconductor devices. FinFET devices typically include semiconductor fins with high aspect ratios in which the channel and source/drain regions for the transistor are formed. A gate is formed over and along the sides of the portion of the fin devices utilizing the advantage of the increased surface area of the channel and source/drain regions to produce faster, more reliable and better-controlled semiconductor transistor devices. Further advantages of FinFETs include reducing the short channel effect and higher current flow.

Current FinFET technology has challenges however. For example, ion implantation is typically used to form a lightly doped drain (LDD) region. Ion implantation creates a non-conformal doping profile of the fin (for example, heavier doping at the top of the fin than the bottom of the fin, which is found closer to the substrate). This non-conformal doping profile may create issues including those associated non-uniform device turn on. By using a tilt implant, the photo resist height induced shadowing effects and pre amorphization (PAI) induced twin boundary defects will be disadvantageous.

As such, an improved fabrication method for a FinFET element is desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The making and using of illustrative embodiments are discussed in detail below. It should be appreciated, however, that the disclosure provides many applicable inventive concepts that can be embodied in a wide variety of specific contexts. The specific embodiments discussed are merely illustrative and do not limit the scope of the invention.

Figure 11:
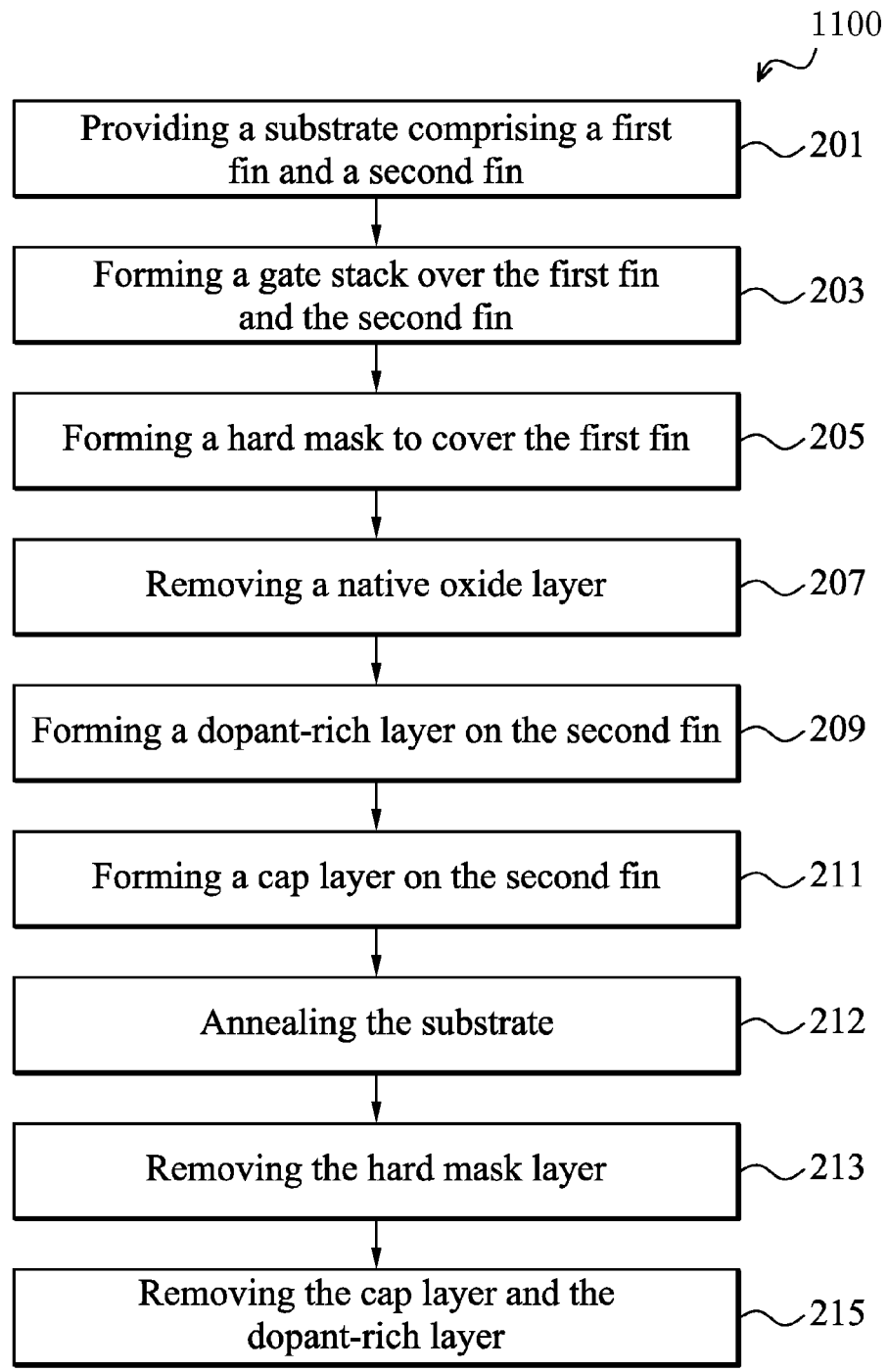
FIG. 11 depicts a flowchart of a method for fabricating FinFET structures according to one embodiment.

FIGS. 1 to 8 are perspective and cross-sectional views of FinFET structure at various stages of manufacture. FIG. 11 depicts a flowchart of a method 1100 for fabricating FinFET structures according to one embodiment of the invention.

Figure 1:
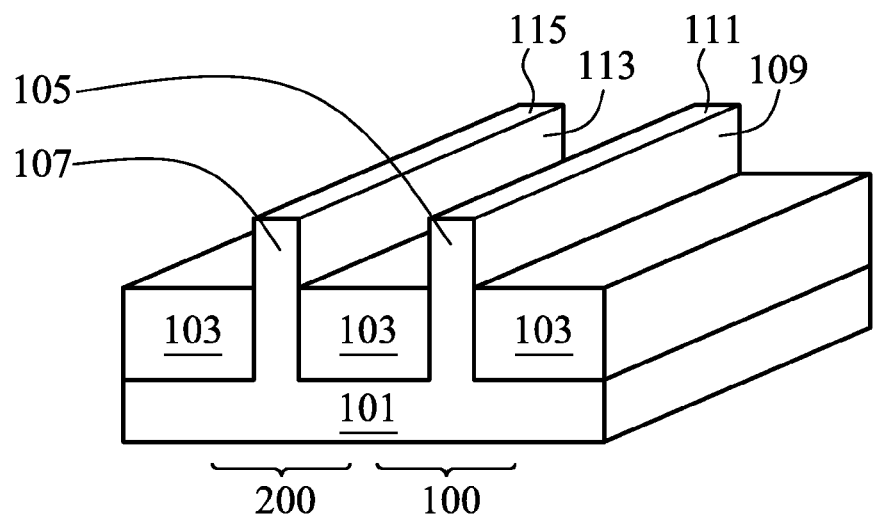
FIGS. 1 to 8 show various stages during fabrication of a FinFET structure on a substrate according to one or more embodiments.

Referring to FIG. 1 and FIG. 11, in process step 201, a substrate comprising a first fin 105 and a second fin 107 is provided. In some embodiments, substrate 101 may be a silicon substrate, a germanium substrate, or a substrate formed of other semiconductor materials. Substrate 101 may be doped with a p-type or an n-type dopant. Isolation regions such as shallow trench isolation (STI) regions 103 may be formed in or over substrate 101. The first semiconductor fin 105 and the second semiconductor fin 107 extend above the top surfaces of STI regions 103. The first semiconductor fin 105 has a top surface 111 and sidewalls 109. The second semiconductor fin 107 has a top surface 115 and sidewalls 113. Substrate 101 includes a portion in first device region 100 and a portion in second device region 200. Semiconductor fins 105 and 107 are in first device region 100 and second device region 200, respectively. In an embodiment, first device region 100 and second device region 200 are used to form one n-type FinFET and one p-type FinFET.

Figure 2:
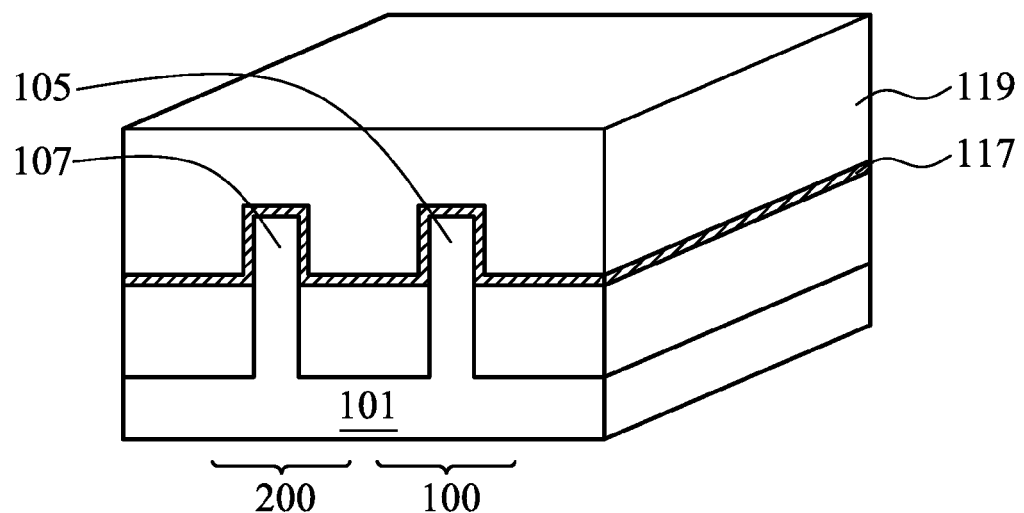

Referring to FIG. 2, gate dielectric layer 117 and gate electrode layer 119 are deposited in both first device region 100 and second device region 200 and over semiconductor fins 105 and 107. In an embodiment, gate dielectric layer 117 is formed of a high dielectric constant (high-k) dielectric material. The exemplary high-k materials may have k values greater than about 4.0, or even greater than about 7.0, and may include aluminum-containing dielectrics such as $Al_2O_3$, HfAlO, HfAlON, or AlZrO; Hf-containing materials such as $HfO_2$, $HfSiO_x$, $HfAlO_x$, $HfZrSiO_x$, or HfSiON; and/or other materials such as $LaAlO_3$ or $ZrO_2$. Gate electrode layer 119 is formed on gate dielectric layer 117, and may be formed of a conductive material such as doped polysilicon, metals, or metal nitrides.

Figure 3:
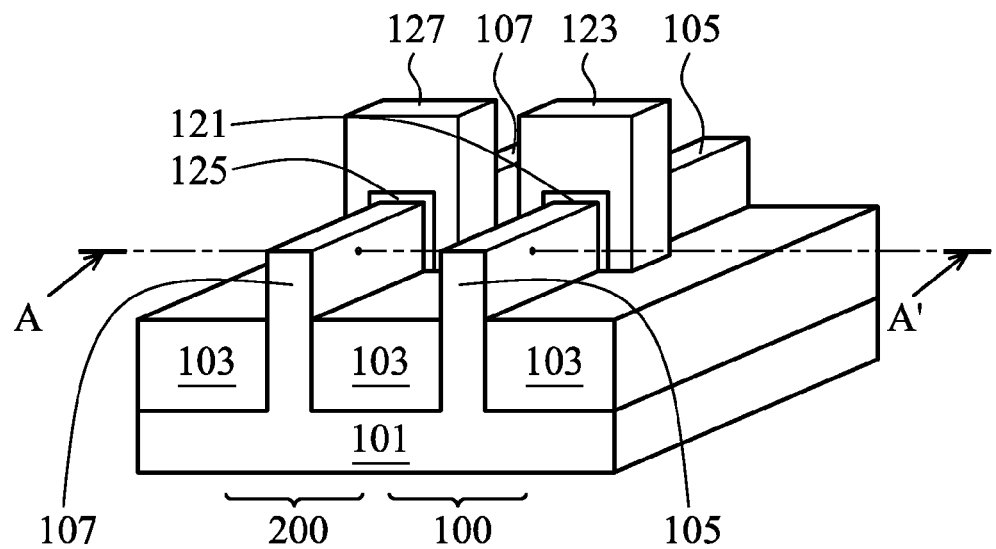

Referring to FIG. 3 and FIG. 11, in process step 203, gate electrode layer 119 and gate dielectric layer 117 are then patterned to form gate stacks. The gate stack in first device region 100 includes gate electrode 123 and gate dielectric 121. The gate stack in second device region 200 includes gate electrode 127 and gate dielectric 125. The gate stacks are over a portion of the top surfaces 111, 115 and the sidewalls 109, 113 of each of the semiconductor fins 105 and 107. In some embodiments, the exposed portions of semiconductor fins 105 and 107 may be left as they are, so that subsequent pocket and lightly doped source and drain (LDD) regions may be formed. In some alternative embodiments, the exposed portions of semiconductor fins 105 and 107 may be removed to form recesses, and semiconductor stressors may be epitaxially re-grown in the resulting recesses. In an exemplary embodiment, the semiconductor stressors in first device region 100 may comprise silicon carbon (SiC), while the semiconductor stressors in second device region 200 may comprise silicon germanium (SiGe)

Figure 4:
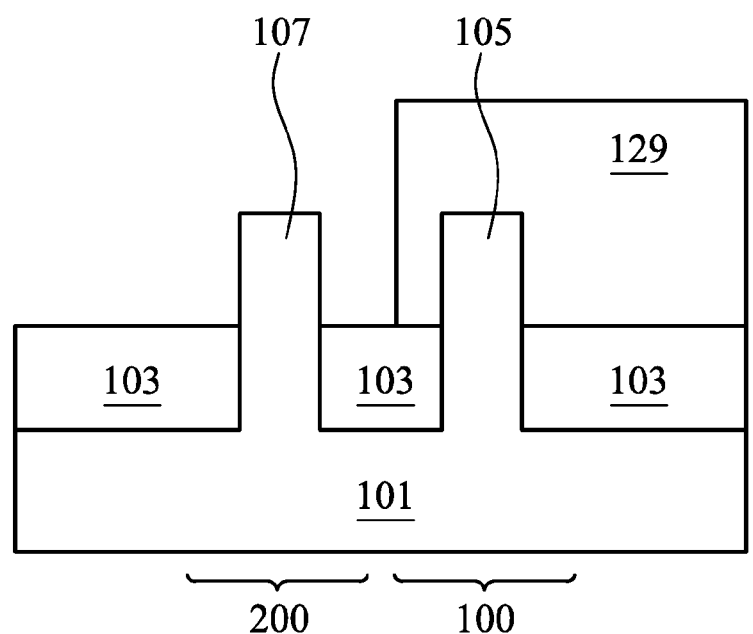

Referring to FIG. 4 and FIG. 11, in process step 205, hard mask 129 is formed and patterned to cover the first device region 100, while leaving the second device region 200 uncovered. FIG. 4 is a cross-sectional view obtained from the vertical plane crossing line A-A' in FIG. 3. Accordingly, the gate stacks are not shown.

Referring to FIG. 11, in process step 207, the process step 207 removes a native oxide layer on the exposed portion of the top surfaces 111, 115 and the sidewalls 109, 113 of each semiconductor fins 105 and 107. In one embodiment, the substrate 101 is dipped in a solution comprising a HF solution, which is diluted at a rate of 350:1. In another embodiment, the wet solution comprises any suitable solution being familiar to the skilled persons in the art. In some embodiments, the process step 207 comprises dry etching process being familiar to the skilled persons in the art.

Figure 5:
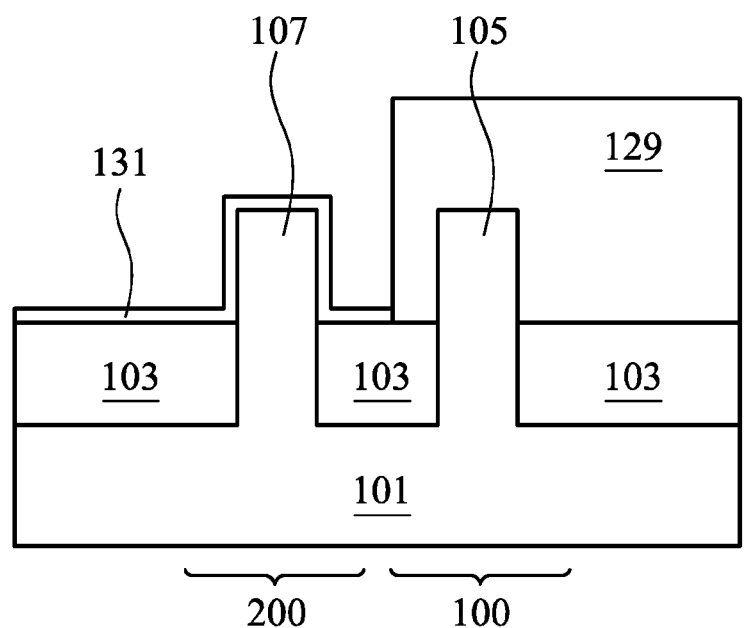
Figure 9:
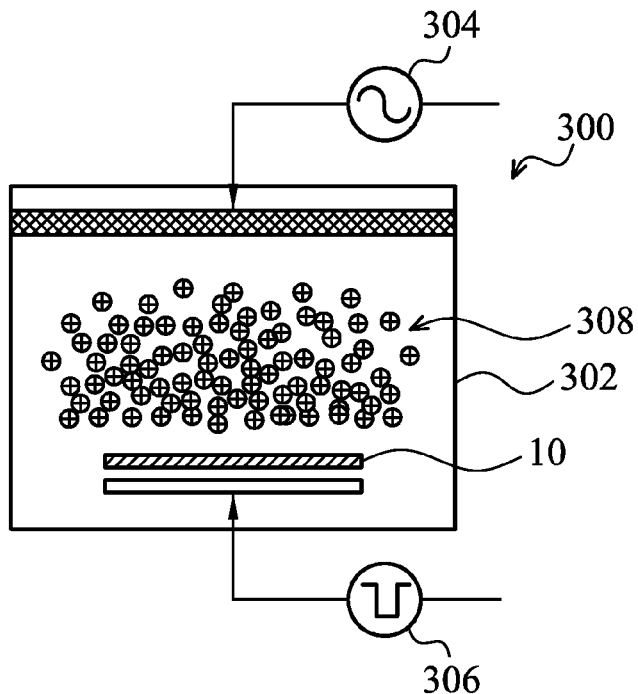
FIG. 9 illustrates an apparatus for performing method in accordance with an embodiment.

Referring to FIG. 5, wafer 10 is placed into apparatus 300 as shown in FIG. 9, which is used for performing a plasma assisted deposition process. Apparatus 300 includes chamber 302, in which wafer 10 is placed, and power sources 304 and 306 connected into chamber 302. Wafer 10 comprises the semiconductor fins 105 and 107 on the substrate 101. Power source 304 may be a radio frequency (RF) power source with programmable pulse modulation function, while power source 306 may be a pulsed DC or RF power source for providing a bias voltage on the wafer 10. Power sources 304 and 306 may be operated independently from each other. Each of the power sources 304 and 306 may be programmed to be independently powered on and off without affecting the other.

Referring to FIG. 5 and FIG. 11, in process step 209, dopant-rich layer 131 is deposited on the top surface 115 and the sidewalls 113 of the second semiconductor fin 107 using production tool 300 as illustrated in FIG. 9. The dopant-rich layer 131 comprises a dopant that is used for forming the desirable LDD regions in the second semiconductor fin 107. Depending on the desirable conductivity type of the resulting FinFET, dopant-rich layer 131 may be formed of an n-type dopant (impurities) or a p-type dopant (impurities). For example, if the resulting FinFET is a p-type FinFET, dopant-rich layer 131 may comprise boron and/or indium, while if the resulting FinFET is an n-type FinFET, dopant-rich layer 131 may comprise phosphorous and/or arsenic. In an exemplary embodiment, the atomic percentage of the desirable dopant in dopant-rich layer 131 may be greater than about 90 percent, and may actually be a pure dopant layer.

The process gases in chamber 302 (refer to FIG. 9) may include $AsH_3$, $B_2H_6$, $PH_3$, $BF_3$, dilution gas such as Xe, Ar, He, Ne, H2 and/or the like, depending on the desirable composition of dopant-rich layer 131. The process may be performed under a pressure less than about 100 mTorr. RF power source 304 (FIG. 9) is turned on to generate plasma 308. The power of RF power source 304 may be between about 50 watts and about 1,000 watts, for example, although a greater or a smaller power may also be used. In an embodiment, RF power source 304 is turned on continuously during the entire period for forming dopant-rich layer 131. In an alternative embodiment, RF power source 304 is pulsed (in an on and off pattern) in order to improve the conformity (the step coverage) of dopant-rich layer 131.

Figure 10:
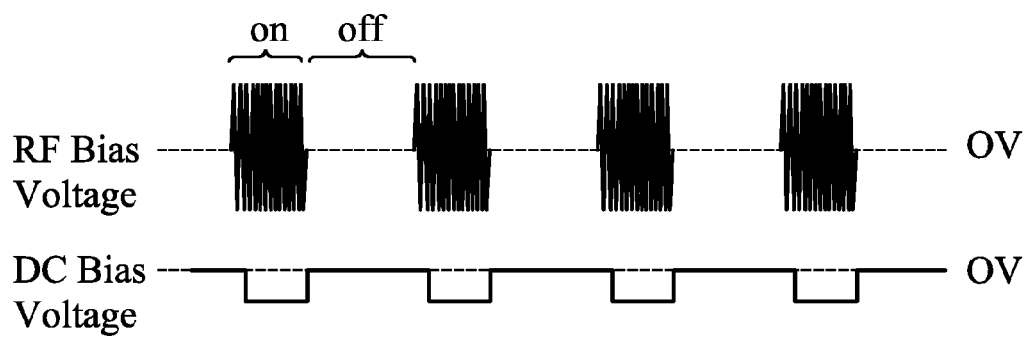
FIG. 10 shows schematic DC and RF bias voltages applied during the deposition of a dopant-rich layer.

During the formation of dopant-rich layer 131, DC power source 306 as in FIG. 9 has a low bias voltage lower than about 2 kV so that there is no unwanted amorphization layer formation during dopant layer formation. In an exemplary embodiment, the bias voltage output of DC power source 306 is between about 0 kV and about 2 kV. With the low or even zero DC bias voltage, the directionality of the ion doping process is reduced, and hence dopant-rich layer 131 may be deposited over the second semiconductor fin 107 as a separate layer, rather being directly implanted into fin 107. The DC bias voltage provided by DC power source 306 during the formation of dopant-rich layer 131 may also be pulsed (turned on and off) with a frequency of about 0.5 to about 10 KHz, as schematically illustrated in FIG. 10.

Figure 6:
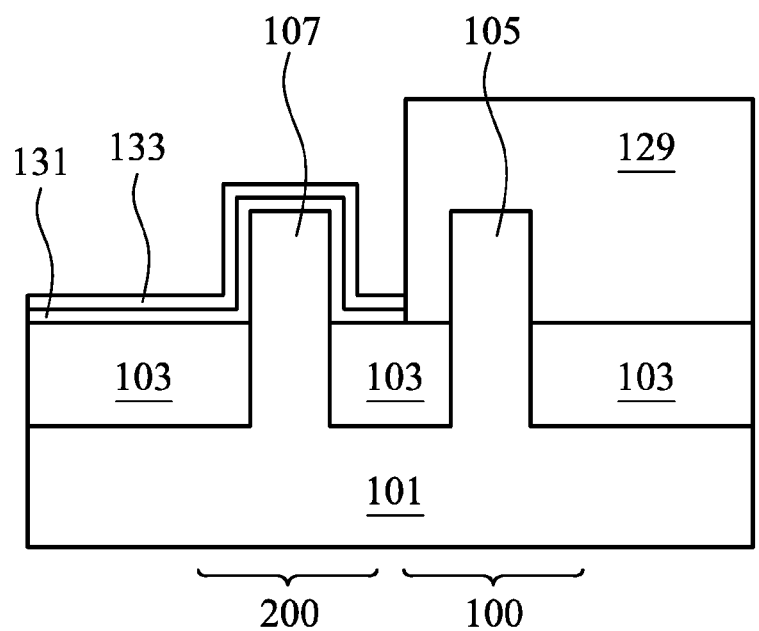

Referring to FIG. 6 and FIG. 11, in process step 211, a cap layer 133 is then deposited over the dopant-rich layer 131 on the second semiconductor fin 107. In some embodiments, the cap layer 133 may include silicon oxide, silicon nitride, silicon carbide or combinations thereof. The cap layer 133 has a thickness between about 30 Å to about 300 Å. Depending on cap layer 133 film density and compactness, the thickness of cap layer 133 should be controlled within a proper range. For example, in some embodiments, when the thickness is thinner than about 30 Å, the dopant in the dopant-rich layer 131 will diffuse out through the cap layer 133 during the following annealing process; when the thickness is thicker than about 300 Å, the cap layer 133 may peel off from the dopant-rich layer 131.

In one embodiment, the cap layer 133 is formed using plasma enhanced atomic layer deposition. Process precursor may include silanediamine, N,N,N',N'-tetraethyl (sold as SAM 24 by Air Liquide) and O2. An operation power of the deposition is about 20 W to about 500 W. The cap layer 133 is formed at a temperature below about 300° C. to prevent the dopant in the dopant-rich layer 131 from diffusing out through the cap layer 133 during the cap layer formation process. In some alternative embodiments, the cap layer 133 may be deposited using other deposition techniques capable of forming a conformal layer of $SiO_2$, $Si_3N_4$, or SiC.

Figure 7:
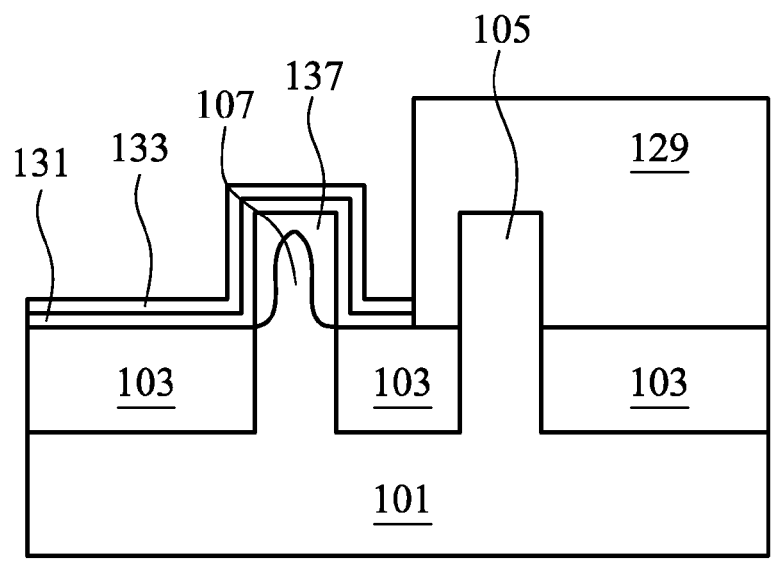

Referring to FIG. 7 and FIG. 11, in process step 212, the substrate 101 is annealed to form a LDD region 137 in the second semiconductor fin 107. The impurities in the dopant-rich layer 131 are activated and diffuse into the second semiconductor fin 107. The cap layer 133 prevents the dopant in the dopant-rich layer 131 from diffuse out through the cap layer 133 during the annealing process. The annealing may be performed at a wafer temperature between about 900° C. and about 1100° C. The annealing may be a millisecond annealing (MSA) or a rapid thermal annealing (RTA).

Next, in FIG. 11 of process step 213, the hard mask layer 129 in the first device region 100 is removed. Referring to FIG. 11, in process step 215, the cap layer 133 and the dopant-rich layer 131 are removed. In one embodiment, the process step 215 comprises dipping the substrate 101 in a wet solution comprising HF. In some embodiments, the process step 215 comprises etching the cap layer 133 and the dopant-rich layer 131 by a dry etching process.

Figure 8:
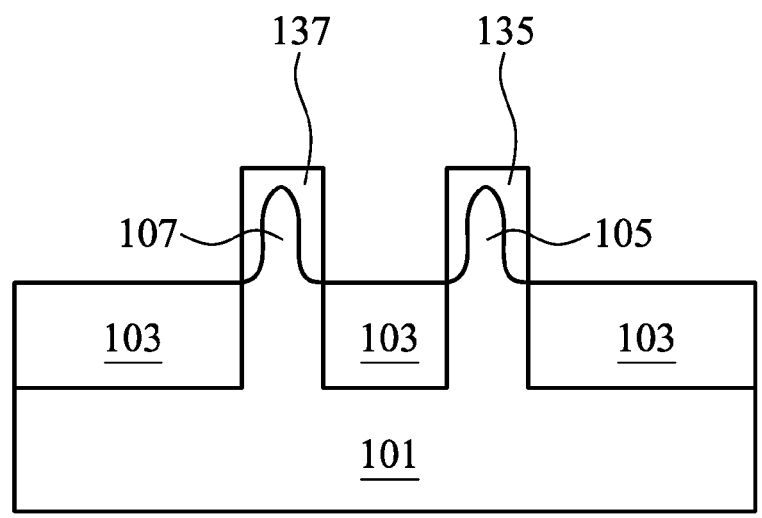

FIG. 8 shows a substrate comprising a first fin 105 and a second fin 107 have LDD region 135 and LDD region 137 respectively. The LDD region 135 may be formed in the first semiconductor fin 105 using essentially the same process as discussed, except the second semiconductor fin 107 is covered by a hard mask during the formation of LDD region 137, and the first semiconductor fin 105 may have an opposite conductivity type than the second semiconductor fin 107. The dopant concentration in LDD regions may be between about $1E20/cm^3$ and about $1E21E/cm^3$, for example.

After the formation of LDD regions 135 and 137, gate spacers (not shown) may be formed. In subsequent process steps, n-type impurities (such as phosphorous) and p-type impurities (such as boron) may be implanted into fins 105 and 107, depending on the desirable conductivity types, to form deep source and drain regions (not shown). The dopant concentration in deep source/drain regions (not shown) may be between about $1\times10^{20}/cm^3$ and about $1\times10^{21}/cm^3$, for example. FinFETs in the first device region 100 and the second device region 200 are thus formed.

FIGS. 1-11 are simplified for a better understanding of the inventive concepts of the present disclosure. For example, although the figures illustrate the FINFETs, it is understood the ICs may also include a number of various devices including resistors, capacitors, inductors, fuses, etc.

Various embodiments of the present invention may be used to moderate the shortcomings of the conventional LDD process. For example, in the various embodiments the formation of dopant-rich layer 131, the formation of cap layer 133 and the annealing process drive the impurities of the LDD region to a desirable depth without the concern of the shadowing effect and PAI induced twin boundary defects. Therefore, electrical performances of the devices can be improved.

One aspect of this description relates to a method of doping a fin field-effect transistor (FinFET). The method includes forming a plurality of semiconductor fins on a substrate wherein each semiconductor fin of the plurality of semiconductor fins has a top surface and sidewalls. The method further includes forming a gate stack over the top surface and sidewalls of each semiconductor fin of the plurality of semiconductor fins. The method further includes removing a portion a first semiconductor fin of the plurality of semiconductor fins exposed by the gate stack. The method further includes growing a first stressor region connected to a remaining portion of the first semiconductor fin. The method further includes exposing a second semiconductor fin of the plurality of semiconductor fins to a deposition process to form a dopant-rich layer comprising an n-type or a p-type dopant on the top surface and the sidewalls of the second semiconductor fin. The method further includes diffusing the dopant from the dopant-rich layer into the second semiconductor fin by performing an annealing process, wherein the first semiconductor fin is free of diffusion of the diffused dopant.

Another aspect of this description relates to a method of doping a fin field-effect transistor (FinFET). The method includes forming a plurality of semiconductor fins on a substrate wherein each semiconductor fin of the plurality of semiconductor fins has a top surface and sidewalls. The method further includes forming a gate stack over the top surface and sidewalls of each semiconductor fin of the plurality of semiconductor fins. The method further includes removing a portion of each semiconductor fin of the plurality of semiconductor fins exposed by the gate stack. The method further includes growing a first stressor region connected to a remaining portion of a first semiconductor fin of the plurality of semiconductor fins. The method further includes growing a second stressor region connected to a remaining portion of a second semiconductor fin of the plurality of semiconductor fins. The method further includes depositing a dopant-rich layer comprising an n-type or a p-type dopant on the top surface and the sidewalls of the second stressor region. The method further includes diffusing the dopant from the dopant-rich layer into the second semiconductor fin using an annealing process, wherein the first semiconductor fin is free of diffusion of the diffused dopant.

Still another aspect of this description relates to a fin field-effect transistor (FinFET). The FinFET includes a plurality of semiconductor fins on a substrate wherein each semiconductor fin of the plurality of semiconductor fins has a top surface and sidewalls. The FinFET further includes a gate stack over the top surface and sidewalls of each semiconductor fin of the plurality of semiconductor fins. The FinFET further includes a first stressor region connected to a portion of a first semiconductor fin of the plurality of semiconductor fins covered by the gate stack, wherein the first stressor region comprises a different material from the portion of the first semiconductor fin covered by the gate stack. The FinFET further includes a lightly doped drain (LDD) region in a second semiconductor fin of the plurality of semiconductor fins.

Although the embodiments and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed:

1. A method of doping a fin field-effect transistor (FinFET), the method comprising:
   forming a plurality of semiconductor fins on a substrate wherein each semiconductor fin of the plurality of semiconductor fins has a top surface and sidewalls;
   forming a gate stack over the top surface and sidewalls of each semiconductor fin of the plurality of semiconductor fins;
   removing a portion of a first semiconductor fin of the plurality of semiconductor fins exposed by the gate stack;
   growing a first stressor region connected to a remaining portion of the first semiconductor fin;
   exposing a second semiconductor fin of the plurality of semiconductor fins to a deposition process to form a dopant-rich layer comprising an n-type or a p-type dopant on the top surface and the sidewalls of the second semiconductor fin; and
   diffusing the dopant from the dopant-rich layer into the second semiconductor fin by performing an annealing process, wherein the first semiconductor fin is free of diffusion of the diffused dopant.

2. The method of claim 1, wherein growing the first stressor region comprises growing the first stressor region comprising silicon carbon (SiC).

3. The method of claim 1, further comprising removing a portion of the second semiconductor fin of the plurality of semiconductor fins exposed by the gate stack.

4. The method of claim 3, further comprising growing a second stressor region connected to a remaining portion of the second semiconductor fin of the plurality of semiconductor fins.

5. The method of claim 4, wherein growing the second stressor region comprises growing the second stressor region comprising silicon germanium (SiGe).

6. The method of claim 4, wherein diffusing the dopant from the dopant-rich layer into the second semiconductor fin comprises diffusing the dopant from the dopant-rich layer into the second stressor region.

7. The method of claim 1, further comprising:
   covering the first stressor region with a second hard mask;
   exposing the first stressor region and the second hard mask to a deposition process to form a second dopant-rich layer comprising an n-type or a p-type dopant on the top surface and the sidewalls of the first stressor region; and
   diffusing the dopant from the second dopant-rich layer into the first stressor region by performing an annealing process.

8. A method of doping a fin field-effect transistor (FinFET), the method comprising:
   forming a plurality of semiconductor fins on a substrate wherein each semiconductor fin of the plurality of semiconductor fins has a top surface and sidewalls;
   forming a gate stack over the top surface and sidewalls of each semiconductor fin of the plurality of semiconductor fins;
   removing a portion of each semiconductor fin of the plurality of semiconductor fins exposed by the gate stack;
   growing a first stressor region connected to a remaining portion of a first semiconductor fin of the plurality of semiconductor fins;
   growing a second stressor region connected to a remaining portion of a second semiconductor fin of the plurality of semiconductor fins;
   depositing a dopant-rich layer comprising an n-type or a p-type dopant on the top surface and the sidewalls of the second stressor region; and
   diffusing the dopant from the dopant-rich layer into the second semiconductor fin using an annealing process, wherein the first semiconductor fin is free of diffusion of the diffused dopant.

9. The method of claim 8, wherein growing the second stressor region comprises growing the second stressor region comprising a different material from the first stressor region.

10. The method of claim 8, further comprising protecting the first semiconductor fin using a hard mask during deposition of the dopant-rich layer.

11. The method of claim 8, further comprising depositing a cap layer over the dopant-rich layer to prevent outward diffusion of the dopant.

12. The method of claim 11, wherein depositing the cap layer comprises depositing the cap layer using plasma enhanced atomic layer deposition.

13. The method of claim 8, wherein growing the first stressor region comprises growing the first stressor region comprising silicon carbon (SiC).

14. The method of claim 8, wherein growing the second stressor region comprises growing the second stressor region comprising silicon germanium (SiGe).

15. The method of claim 8, wherein diffusing the dopant from the dopant-rich layer into the second semiconductor fin comprises diffusing the dopant from the dopant-rich layer into the second stressor region.

16. The method of claim 8, further comprising:
   depositing a second dopant-rich layer on the top surface and the sidewalls of the first stressor region, wherein the second dopant-rich layer comprises an n-type or a p-type dopant; and
   diffusing the dopant from the second dopant-rich layer into the first stressor region using an annealing process.

17. A fin field-effect transistor (FinFET) comprising:
   a plurality of semiconductor fins on a substrate wherein each semiconductor fin of the plurality of semiconductor fins has a top surface and sidewalls;
   a gate stack over the top surface and sidewalls of each semiconductor fin of the plurality of semiconductor fins;
   a first stressor region connected to a portion of a first semiconductor fin of the plurality of semiconductor fins covered by the gate stack, wherein the first stressor region comprises a different material from the portion of the first semiconductor fin covered by the gate stack;
   a first lightly doped drain (LDD) region in a second semiconductor fin of the plurality of semiconductor fins; and
   a second stressor region connected to a portion of the second semiconductor fin covered by the gate stack, wherein the first LDD region is in the second stressor region.

18. The FinFET of claim 17, wherein the second stressor region comprises silicon germanium (SiGe).

19. The FinFET of claim 17, wherein the first stressor region comprises silicon carbon (SiC).

20. The FinFET of claim 17, further comprising a second LDD region in the first stressor region.

\* \* \* \* \*